US006478933B1

(12) United States Patent
Dam et al.

(10) Patent No.: US 6,478,933 B1
(45) Date of Patent: Nov. 12, 2002

(54) METHOD FOR CREATING SURFACE OIL RESERVOIRS ON COATED IRON

(75) Inventors: Chuong Q. Dam; Robert E. Hawbaker, both of Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 09/465,846

(22) Filed: Dec. 17, 1999

(51) Int. Cl.⁷ ............................ C23C 16/00; C23C 14/35
(52) U.S. Cl. .............................. 204/192.3; 204/192.12; 204/192.15; 204/192.38; 427/532; 427/534; 427/535; 427/580
(58) Field of Search ........................ 204/192.12, 192.15, 204/192.3, 192.38; 427/532, 534, 580, 535

(56) References Cited

U.S. PATENT DOCUMENTS

| | | |
|---|---|---|
| 2,968,555 A | 1/1961 | Bendler et al. |
| 4,232,912 A | 11/1980 | Williamson |
| 4,312,900 A | 1/1982 | Simpson |
| 4,678,738 A | 7/1987 | Shimizu et al. |
| 4,804,445 A | 2/1989 | Ohta et al. .................... 204/39 |
| 5,346,600 A * | 9/1994 | Nieh et al. ................ 204/192.3 |
| 5,487,922 A | 1/1996 | Nieh et al. .................. 422/528 |
| 5,807,613 A * | 9/1998 | Ageuro et al. .............. 427/528 |
| 6,296,942 B1 * | 10/2001 | Eaton, Jr. et al. ........... 428/446 |

FOREIGN PATENT DOCUMENTS

| | | |
|---|---|---|
| DE | 3824261 C1 | 3/1989 |
| GB | 723236 | 2/1995 |

OTHER PUBLICATIONS

Patent Abstracts of Japan vol. 014, No. 435 (c–0706) Sep. 18, 1990 (Sep. 18, 1990) & JP 02 170885A Mitsubishi Electric Corp.
Patent Abstracts ofJapan vol. 011, No. 297 (c–488); Sep. 25, 1997 (Sep. 25, 1987) & JP 62 086198 A (Suzuki Motor Co Ltd).

* cited by examiner

*Primary Examiner*—Rodney G. McDonald
(74) *Attorney, Agent, or Firm*—Kathleen R. Carey

(57) ABSTRACT

A process for increasing the lubrication of ductile-iron lubricated contacts includes abrasive-blasting and plasma etching a ductile-iron component prior to coating. A wear resistant or low friction coating is then formed on the iron substrate and the resulting coated component has greater lubrication than a corresponding non-blasted and non-coated component.

8 Claims, No Drawings

400;
METHOD FOR CREATING SURFACE OIL RESERVOIRS ON COATED IRON

TECHNICAL FIELD

This invention relates generally to a process of abrasive-blasting and plasma etching a ductile-iron substrate to create surface oil reservoirs, which are then coated to provide a wear resistant iron article.

BACKGROUND ART

It has been recognized by researchers in the field of oil lubricated contacts, such as gears and rollers, that the lubrication of oil lubricated iron contacts is enhanced by physical vapor deposition (PVD) coatings. Wear-resistant PVD coatings applied to surfaces can enhance performance by reducing friction and wear. Typically, the deposition of a PVD coating on an iron substrate is accomplished by a chemical cleaning process, such as ultrasonic alkaline cleaning, followed by plasma etching, and then by the deposition process. Typically, iron articles that are relatively smooth or free from scale or oxides do not undergo an abrasive-blasting process prior to coating.

It has been theorized that in oil lubricated contacts, surface texture features, such as grooves or channels, for example, honed surfaces found in cylinder liners, can function as lubricant reservoirs. The reservoirs provide lubrication to the contact surfaces in situations which may be devoid of any lubrication, for example, during start-up or while in low speed motion. However, none of the prior art references teach or suggest a process to create surface oil reservoirs on an iron substrate for the purpose of improving lubrication.

It has long been desirable to have a process for improving the lubrication of iron parts. It has been even more desirable to accomplish the above objectives without detrimentally tempering the iron part.

None of the references teach or suggest surface oil reservoirs on the surface of the iron for the purpose of enhancing oil film thickness, friction coefficient, contact stresses and contact temperatures which influence pitting and scuffing performance.

DISCLOSURE OF THE INVENTION

In one aspect of the present invention, a process for increasing the lubrication of iron lubricated contacts is disclosed. The process comprises the following steps. An iron component having a ductile-iron substrate is provided. The surface of the ductile-iron substrate is abrasive-blasted and plasma etched to create surface oil reservoirs. A coating is then formed on the ductile-iron substrate by a deposition process.

In another aspect of the present invention, a ductile-iron article having improved lubrication characteristics is disclosed. The article comprises a ductile-iron substrate with surface oil reservoirs and a PVD coating deposited thereon.

BEST MODE FOR CARRYING OUT THE INVENTION

A ductile-iron substrate is first prepared. The ductile-iron substrate is then cleaned by abrasive-blasting and plasma etching. Abrasive blasting is well-known in the art. Abrasive materials are selected from one of aluminum oxide, glass beads, cast steel shot, and cast iron shot. In the preferred embodiment, the abrasive material is aluminum oxide with a particle size in the range of about three microns to about 300 microns, preferably in the range of about of about three to seven microns. After cleaning the ductile-iron substrate by abrasive blasting, surface oil reservoirs, or pockets, are created on the surface of the iron article due to the preferential abrasion, i.e. erosion, of the graphite nodules present in the ductile-iron microstructure.

Then, the ductile-iron substrate is plasma etched prior to coating. Plasma etching techniques are well known to those skilled in the art.

In the preferred embodiment, the process further comprises the step of depositing a wear-resistant or low-friction coating on the substrate by physical vapor deposition(PVD) techniques, such as arc evaporation or magnetron sputtering. It is contemplated within the scope of the invention that other deposition techniques may be utilized to produce the coating.

The preferred coating is diamond-like-carbon(DLC) because it results in improved performance in boundary lubrication while maintaining or reducing the friction of coefficient of the lubricated contact.

In the preferred embodiment, the coating has a thickness desirably no greater than about 25 microns and preferably has a thickness in the range of about between three and seven microns. A coating thickness greater than about 25 microns is undesirable because the coating may develop residual stresses high enough to separate the coating from the substrate.

INDUSTRIAL APPLICABILITY

Articles formed according to the above process are particularly useful as gears, rollers and similar articles which utilize oil lubricated contacts or are in sliding contact. Further, by so providing the unique surface oil reservoirs of this invention, the resultant article yields improved service life. It also saves material and reduces manufacturing cost.

Other aspects, objects and advantages of this invention can be obtained from a study of the disclosure and the appended claims.

What is claimed is:

1. A method for forming surface oil reservoirs on a coated ductile-iron substrate, comprising:

preparing an iron substrate;

abrasive-blasting said iron substrate to form surface oil reservoirs through erosion of graphite nodules in said iron substrate;

plasma etching said iron substrate; and depositing a coating on said iron substrate by a deposition process.

2. A method, as set forth in claim 1, wherein abrasive-blasting includes an abrasive material selected from one of aluminum oxide, glass beads, cast steel shot, and cast iron shot.

3. A method, as set forth in claim 2, wherein said abrasive material is aluminum oxide.

4. A method, as set forth in claim 2, wherein said abrasive material has a particle size in the range of about three microns to about 300 microns.

5. A method, as set forth in claim 1, wherein said coating is deposited by physical vapor deposition.

6. A method, as set forth in claim 5, wherein said coating is deposited by arc evaporation.

7. A method, as set forth in claim 5, wherein said coating is deposited by magnetron sputtering.

8. A method, as set forth in claim 5, wherein said coating has a thickness in the range of about one micron to about 25 microns.

* * * * *